(12) United States Patent
Cao et al.

(10) Patent No.: US 8,772,782 B2
(45) Date of Patent: Jul. 8, 2014

(54) TRANSISTOR EMPLOYING VERTICALLY STACKED SELF-ALIGNED CARBON NANOTUBES

(75) Inventors: Qing Cao, Yorktown Heights, NY (US); Dechao Guo, Fishkill, NY (US); Shu-Jen Han, Cortlandt Manor, NY (US); Yu Lu, Hopewell Junction, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 260 days.

(21) Appl. No.: 13/303,785

(22) Filed: Nov. 23, 2011

(65) Prior Publication Data
US 2013/0126830 A1     May 23, 2013

(51) Int. Cl.
*H01L 29/12*     (2006.01)

(52) U.S. Cl.
USPC ...... 257/66; 257/192; 257/E27.06; 257/E29.028; 257/E29.04; 257/E29.051; 977/742; 977/938; 977/842

(58) Field of Classification Search
None
See application file for complete search history.

(56) References Cited

U.S. PATENT DOCUMENTS

| | | | |
|---|---|---|---|
| 6,891,227 B2 | 5/2005 | Appenzeller et al. | |
| 6,969,690 B2 | 11/2005 | Zhou et al. | |
| 7,253,431 B2 | 8/2007 | Afzali-Ardakani et al. | |
| 7,504,132 B2 | 3/2009 | Afzali-Ardakani et al. | |
| 7,535,016 B2 | 5/2009 | Furukawa et al. | |
| 7,692,249 B2 | 4/2010 | Zhang | |
| 7,723,756 B2 | 5/2010 | Thomas | |
| 7,829,883 B2 | 11/2010 | Furukawa et al. | |
| 2005/0145838 A1 | 7/2005 | Furukawa et al. | |
| 2006/0169972 A1 | 8/2006 | Furukawa et al. | |
| 2008/0102213 A1 | 5/2008 | Afzali-Ardakani et al. | |
| 2011/0260290 A1* | 10/2011 | Kalra et al. | 257/538 |

OTHER PUBLICATIONS

Jung, Y.J., et al., "High Density, Large-Area Single Walled Carbon Nanotube Networks on Nanoscale Patterned Substrates" J. Phys. Chem. B. (May 2003) pp. 6859-6868, vol. 107.
Bourgoin, JP., et al., "Directed assembly for carbon nanotube device fabrication", 2006 International Electron Devices Meeting (Dec. 2006) 4 pages.
Tulevski, G.S., et al., "Chemically Assisted Directed Assembly of Carbon Nanotubes for the Fabrication of Large-Scale Device Arrays" J. Am. Chem. Soc. (Sep. 7, 2007) pp. 11964-11968, vol. 129.
Hannon, J.B., et al., "Selective Placement of Carbon Nanotubes on Metal-Oxide Surfaces" Langmuir, The ACS Journal of Surface and Colloids (Sep. 2005) pp. 8566-8571, vol. 21, No. 19.

* cited by examiner

*Primary Examiner* — Fei Fei Yeung Lopez
(74) *Attorney, Agent, or Firm* — Scully, Scott, Murphy & Presser, P.C.; Vazken Alexanian

(57) ABSTRACT

A fin structure including a vertical alternating stack of a first isoelectric point material layer having a first isoelectric point and a second isoelectric material layer having a second isoelectric point less than the first isoelectric point is formed. The first and second isoelectric point material layers become oppositely charged in a solution with a pH between the first and second isoelectric points. Negative electrical charges are imparted onto carbon nanotubes by an anionic surfactant to the solution. The electrostatic attraction causes the carbon nanotubes to be selectively attached to the surfaces of the first isoelectric point material layer. Carbon nanotubes are attached to the first isoelectric point material layer in self-alignment along horizontal lengthwise directions of the fin structure. A transistor can be formed, which employs a plurality of vertically aligned horizontal carbon nanotubes as the channel.

25 Claims, 14 Drawing Sheets

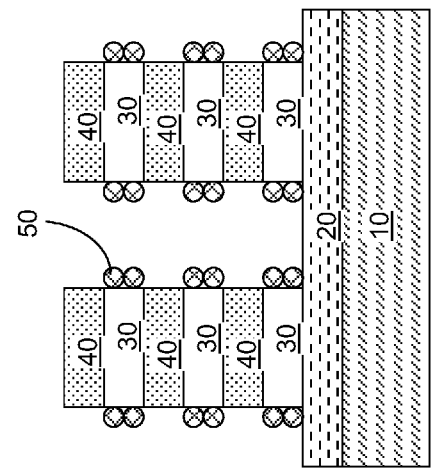
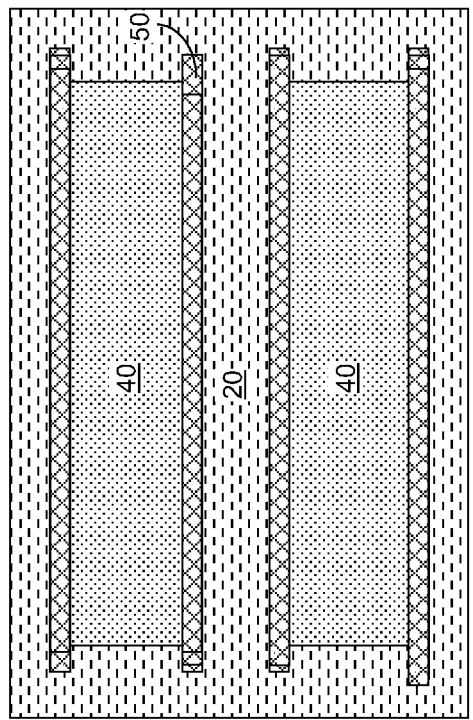
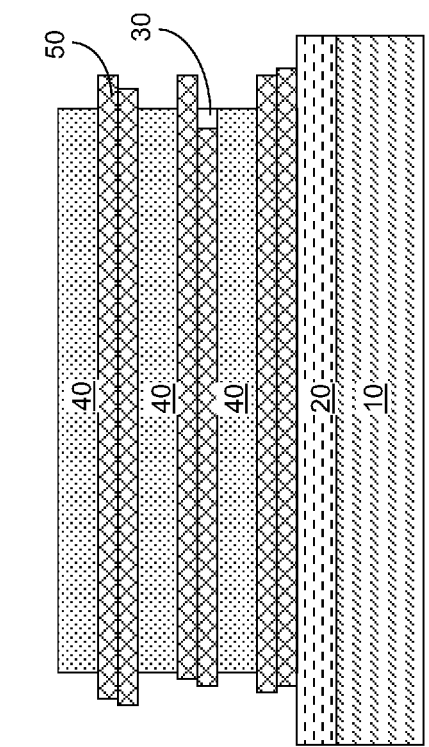

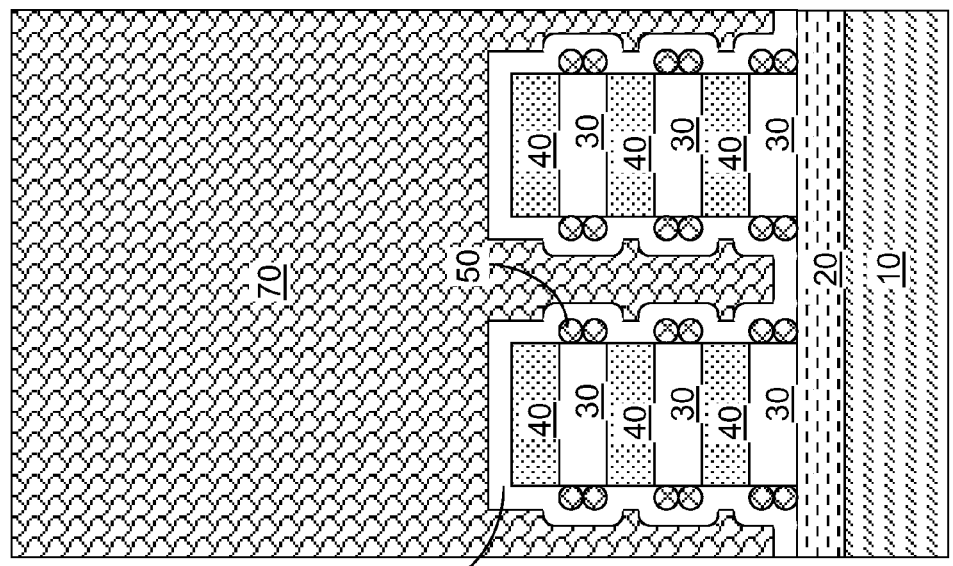
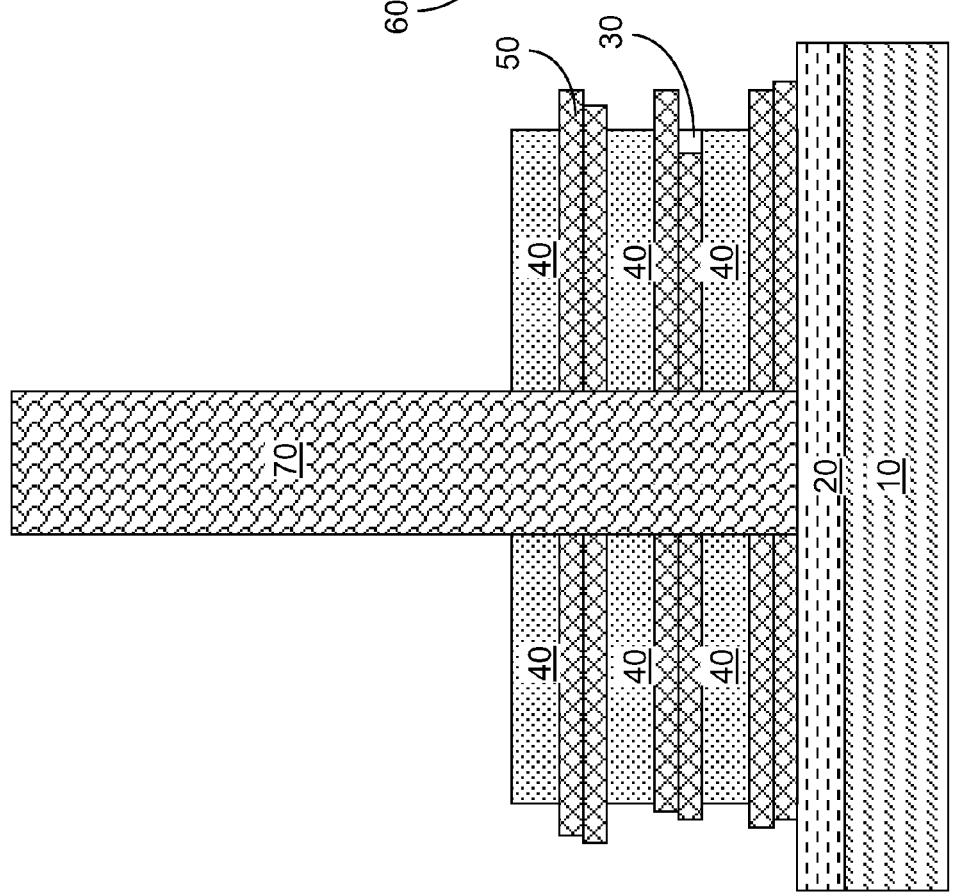

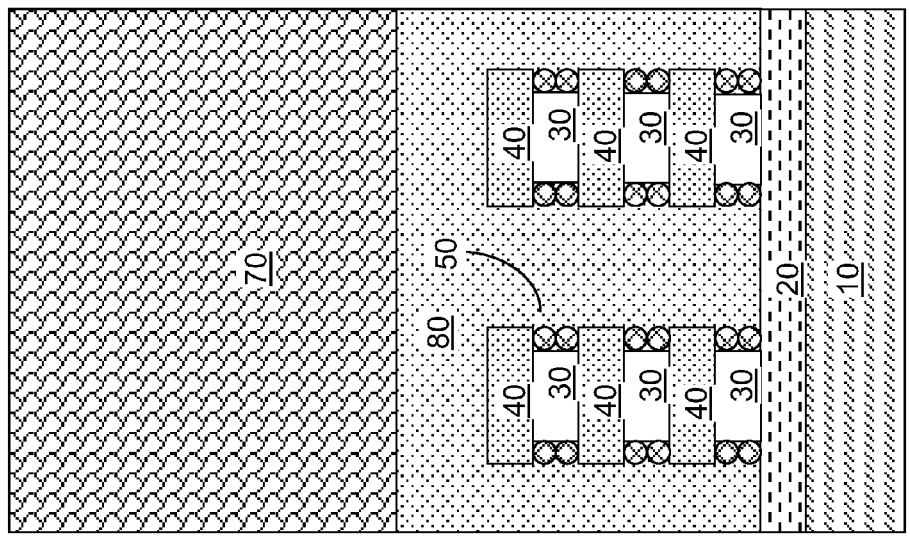
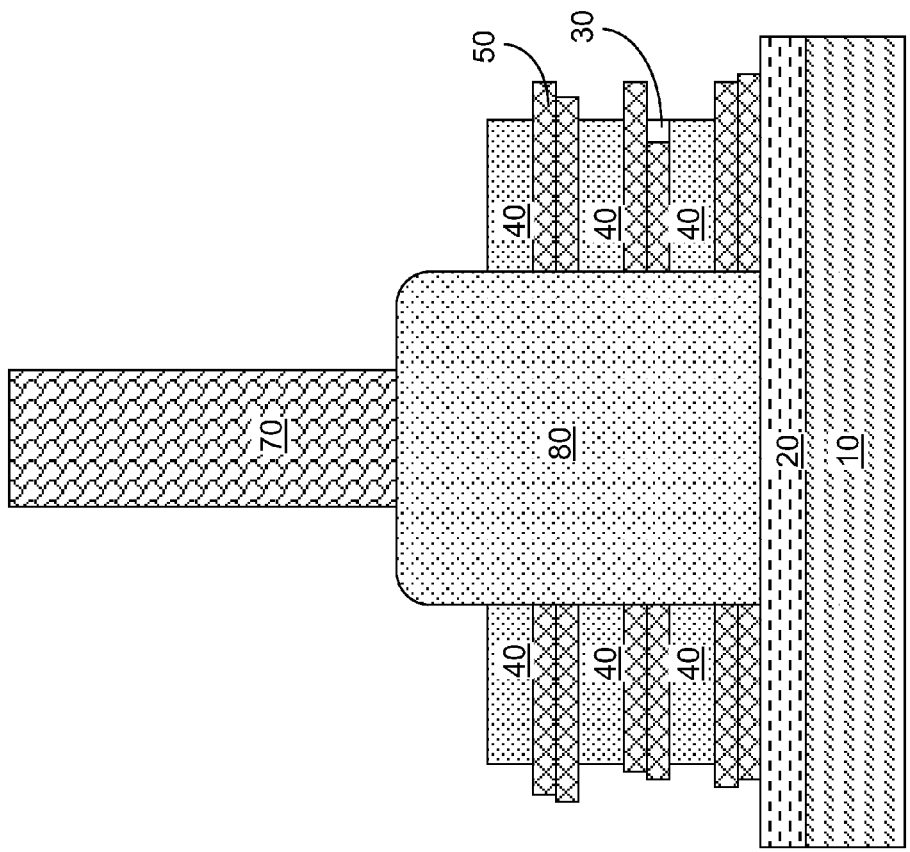
FIG. 8A
FIG. 8B

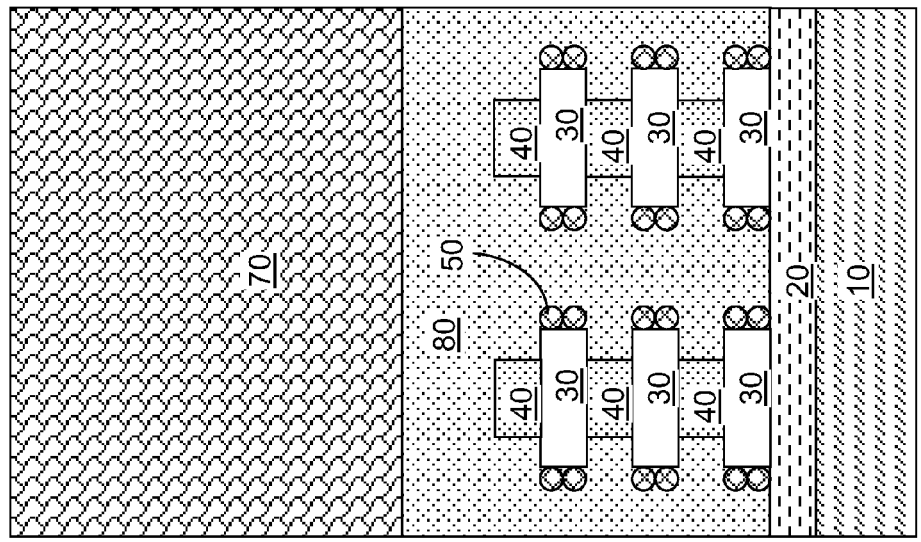
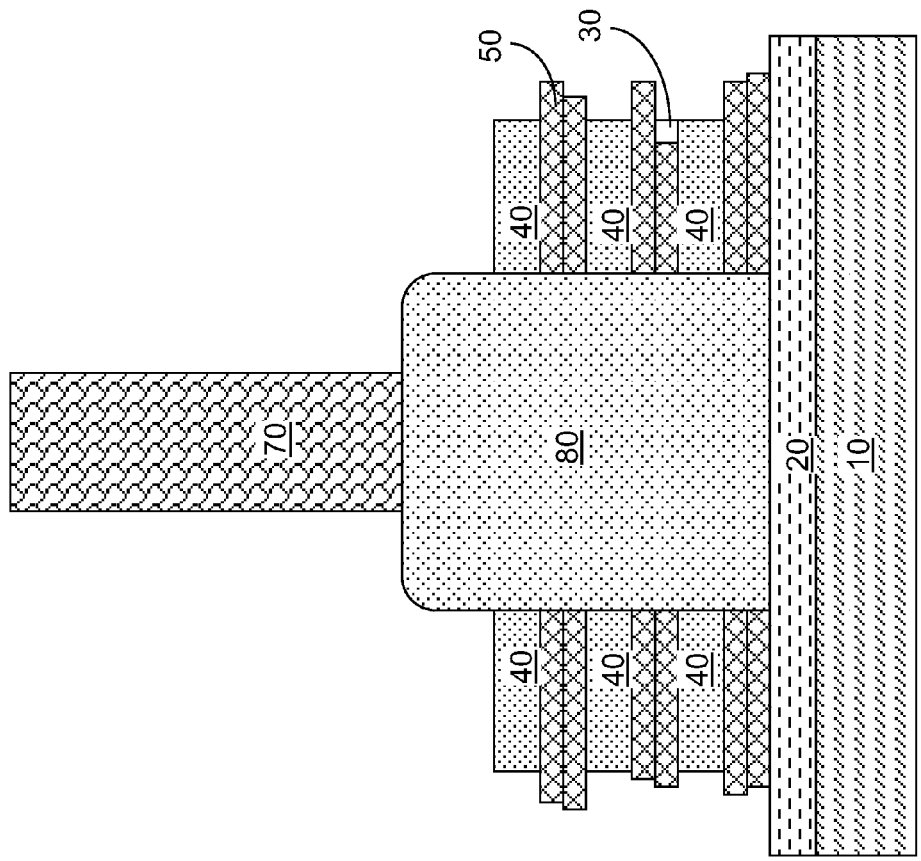

TRANSISTOR EMPLOYING VERTICALLY STACKED SELF-ALIGNED CARBON NANOTUBES

BACKGROUND

The present disclosure relates to a carbon nanotube device, and particularly to a field effect transistor employing a set of vertically stacked and self-aligned carbon nanotubes on a fin structure and methods of manufacturing the same.

One of the difficulties in forming carbon nanotube devices is in the alignment of carbon nanotubes along a single direction so that the carbon nanotubes are oriented along a direction compatible with subsequent lithographic processing steps. While various methods have been proposed in the art, a method is still needed for aligning a plurality of carbon nanotubes along a same direction to employ the plurality of carbon nanotubes as parallel channels of a single field effect transistor capable of carrying a sufficient quantity of electrical current.

BRIEF SUMMARY

A fin structure including a vertical alternating stack of a first isoelectric point material layer having a first isoelectric point and a second isoelectric material layer having a second isoelectric point less than the first isoelectric point is formed. By placing the fin structure in a solution having a pH between the first isoelectric point and the second isoelectric point, the first and second isoelectric point material layers become oppositely charged. Negative electrical charges are imparted onto carbon nanotubes by an anionic surfactant to the solution. The electrostatic attraction between positive charges on the first isoelectric point material layer and the negatively charged carbon nanotubes causes the carbon nanotubes to be selectively attached to the surfaces of the first isoelectric point material layer. The height-to-length ratio of each first isoelectric point material layer is selected so that carbon nanotubes are attached to the first isoelectric point material layer in self-alignment along horizontal lengthwise directions of the fin structure. A gate dielectric and a gate electrode can be formed over a middle portion of the fin structure, and a gate spacer can be formed on sidewalls of the gate electrode. Metal contact structures can then formed on both ends of the fin structure as a source contact structure and a drain contact structure. A transistor can be formed, which employs a plurality of vertically aligned horizontal carbon nanotubes as the channel.

According to an aspect of the present disclosure, a structure is provided, which includes: a fin structure located on a substrate, having a length in a lengthwise direction and a width in a widthwise direction, and including at least one pair of layers, wherein each pair of layers within the at least one pair of layers includes a first isoelectric point material layer having a first isoelectric point and a second isoelectric point material layer having a second isoelectric point that is different from the first isoelectric point; and carbon nanotubes located on lengthwise sidewalls of the at least one first isoelectric point material layer, wherein at least one second isoelectric point material layer is not in contact with a surface of any carbon nanotube.

According to another aspect of the present disclosure, a method of forming a structure is provided, which includes forming a fin structure on a substrate. The fin structure has a length in a lengthwise direction and a width in a widthwise direction, and the fin structure includes at least one pair of layers. Each pair of layers within the at least one pair of layers includes a first isoelectric point material layer having a first isoelectric point and a second isoelectric point material layer having a second isoelectric point that is different from the first isoelectric point. The method further includes attaching carbon nanotubes to the at least one first isoelectric point material layer by immersing the fin structure in a carbon nanotube-including solution having a pH between the first isoelectric point and the second isoelectric point and including an ionic surfactant. The carbon nanotubes are electrostatically attracted to the at least one first isoelectric point material layer, and are electrostatically repelled from the at least one second isoelectric point material layer.

For example, a positively charged monolayer such as 4-(N-hydroxycarboxamido)-1-methylpyridinium iodide (NMPI) can be employed to impart charges to a higher isoelectric point surface, thereby forming a selectively assembled monolayer that is present only on the higher isoelectric point surface, and not on a lower isoelectric point surface. Negatively charged carbon nanotubes are electrostatically attracted to the charged monolayer.

BRIEF DESCRIPTION OF THE SEVERAL VIEWS OF THE DRAWINGS

FIG. 4A is a top-down of the first exemplary structure after removal from the carbon-nanotube including bath according to the first embodiment of the present disclosure.

FIG. 4B is a front view of the first exemplary structure of FIG. 4A.

FIG. 4C is a side view of the first exemplary structure of FIG. 4A.

FIG. 5B is a front view of the first exemplary structure of FIG. 5A.

FIG. 5C is a side view of the first exemplary structure of FIG. 5A.

FIG. 8A is a front view of a second exemplary structure after formation of a dielectric gate spacer according to a second embodiment of the present disclosure.

FIG. 8B is a side view of the second exemplary structure of FIG. 8A.

FIG. 9A is a front view of a second exemplary structure after formation of a dielectric gate spacer according to a second embodiment of the present disclosure.

FIG. 9B is a side view of the second exemplary structure of FIG. 9A.

DETAILED DESCRIPTION

Figure 1A:
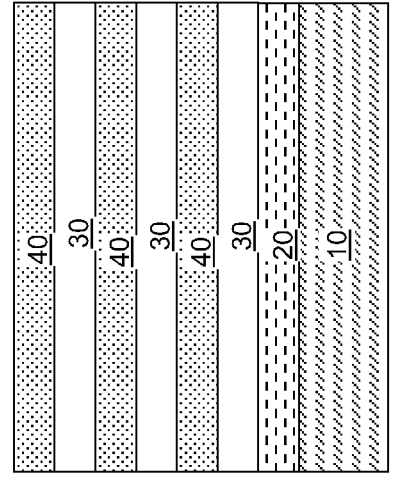
FIG. 1A is a top-down of a first exemplary structure after formation of vertically alternating stacks of a first isoelectric point material layer and a second isoelectric point material layer according to a first embodiment of the present disclosure.

As stated above, the present disclosure relates to a field effect transistor employing a set of vertically stacked and self-aligned carbon nanotubes on a fin structure and methods of manufacturing the same, which are now described in detail with accompanying figures. It is noted that like reference numerals refer to like elements across different embodiments.

Figure 1B:
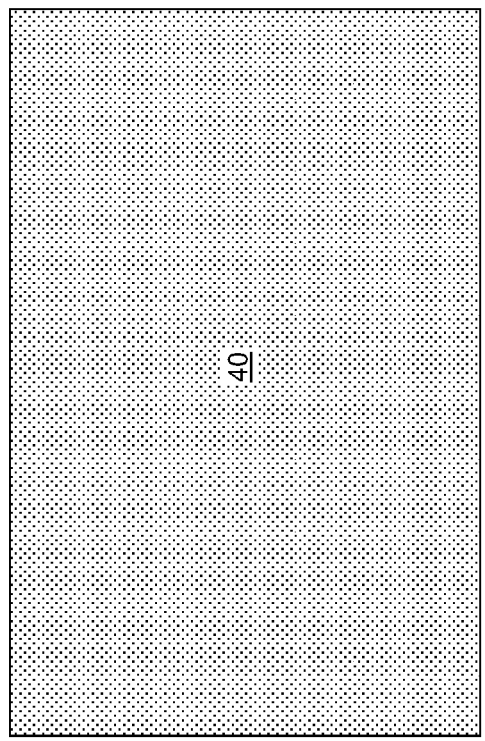
FIG. 1B is a front view of the first exemplary structure of FIG. 1A.
Figure 1C:
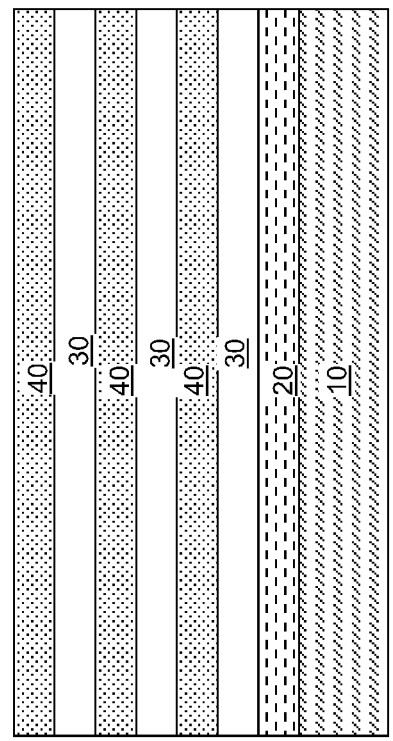
FIG. 1C is a side view of the first exemplary structure of FIG. 1A.

Referring to FIGS. 1A-1C, a first exemplary structure according to a first embodiment of the present disclosure includes a substrate 10, a dielectric material layer 20 formed on a top surface of the substrate 10, and at least one vertically alternating stack of a first isoelectric point material layer 30 and a second isoelectric point material layer 40. Each vertically alternating stack includes, from bottom to top, a pair of layers including a first isoelectric point material layer 30 and a second isoelectric point material layer 40. In one embodiment, the at least one pair of layers is formed as a plurality of pairs of layers that constitute an alternating stack of the first isoelectric point material layer 30 and the second isoelectric point material layer 40.

The substrate 10 can include a dielectric material, a semiconductor material, a conductive material, or a combination thereof. The thickness of the substrate 10 is selected so that the substrate 10 provides mechanical support for the dielectric material layer 20 and the at least one vertically alternating stack (30, 40). For example, the thickness of the substrate 10 can be from 50 microns to 2 mm, although lesser and greater thicknesses can also be employed.

The dielectric material layer 20 includes a dielectric material such as silicon nitride, doped or undoped silicon oxide, a dielectric metal oxide, or a combination thereof. The thickness of the dielectric material layer 20 can be from 1 nm to 1 microns, although lesser and greater thicknesses can also be employed. If the substrate 10 includes a dielectric material at a top portion thereof, the dielectric material layer 20 can be omitted.

Each first isoelectric point material layer 30 includes a first isoelectric point material having a first isoelectric point. Each second isoelectric point material layer 40 includes a second isoelectric point material having a second isoelectric point that is different from the first isoelectric point. As used herein, an isoelectric point is the pH at which a particular molecule or surface carries no net electrical charge. Thus, the first isoelectric point is the pH at which surfaces of the first isoelectric point material layer 30 carries no net electrical charge, and the second isoelectric point is the pH at which surfaces of the second electric point material layer 40 carries no net electrical charge.

The first isoelectric point material and the second isoelectric point material are selected so that the first isoelectric point is different from the second isoelectric point.

In one embodiment, the first isoelectric point is greater than the second isoelectric point. In one embodiment, the first isoelectric point is greater than the second isoelectric point by at least 2.0. In one embodiment, the first isoelectric point is greater than the second isoelectric point by at least 4.0. For example, the first isoelectric point material can be selected from silicon nitride and dielectric metal oxides, and the second isoelectric point material can be silicon oxide. Dielectric metal oxides such as hafnium oxide have an isoelectric point about 8.0. Silicon nitride has an isoelectric point about 6.5. Silicon oxide has an isoelectric point of about 2.0.

In one embodiment, the first isoelectric point is less than the second isoelectric point. In one embodiment, the first isoelectric point is less than the second isoelectric point by at least 2.0. In one embodiment, the first isoelectric point is less than the second isoelectric point by at least 4.0. For example, the first isoelectric point material can be silicon oxide, and the second isoelectric point material can be selected from silicon nitride and dielectric metal oxides.

In one embodiment, each first isoelectric point material layer 30 has a thickness that is greater than a minimum diameter of a semiconducting carbon nanotube. In one embodiment, each first isoelectric point material layer 30 can have a thickness that corresponds to 1-100 times a diameter of a semiconducting carbon nanotube. In one embodiment, each first isoelectric point material layer 30 can have a thickness selected from a range between 1.5 nm and 300 nm.

In one embodiment, each first isoelectric point material layer 30 can have a thickness that corresponds to 1-10 times a diameter of a semiconducting carbon nanotube. In one embodiment, each first isoelectric point material layer 30 can have a thickness selected from a range between 1.5 nm and 15 nm.

In one embodiment, each first isoelectric point material layer 30 can have a thickness corresponding to a diameter of a single wall semiconducting carbon nanotube. In one embodiment, each first isoelectric point material layer 30 can have a thickness from 1.5 nm to 2.5 nm.

In one embodiment, each first isoelectric point material layer 30 can have a thickness corresponding to twice a diameter of a single wall semiconducting carbon nanotube. In one embodiment, each first isoelectric point material layer 30 can have a thickness from 3.0 nm to 5.0 nm.

In one embodiment, each first isoelectric point material layer 30 has a thickness corresponding to twice a diameter of a single wall semiconducting carbon nanotube. In one embodiment, each first isoelectric point material layer 30 can have a thickness from 3.0 nm to 5.0 nm.

The thickness of each second isoelectric point material layer 40 is greater than 0.5 nm. In one embodiment, the thickness of each second isoelectric point material layer 40 can be, for example, from 1.5 nm to 300 nm, although lesser and greater thicknesses can also be employed.

If a plurality of first isoelectric point material layers 30 is present, the thickness of each first isoelectric point material layer 30 can be the same as, or different from, the thickness(es) of other first isoelectric point material layers 30. Likewise, if a plurality of second isoelectric point material layers 40 is present, the thickness of each second isoelectric point material layer 40 can be the same as, or different from, the thickness(es) of other second isoelectric point material layers 40.

Each first isoelectric point material layer 30 and each second isoelectric point material layer 40 can be deposited, for example, by chemical vapor deposition (CVD), atomic layer deposition (ALD), spin coating, physical vapor deposition (PVD), or a combination thereof.

Each vertically adjacent pair of a first isoelectric point material layer 30 and a second isoelectric point material layer constitutes a bilayer stack that includes a pair of layers, i.e., a first isoelectric point material layer 30 and a second isoelectric point material layer 40. The number of vertically alternating stacks, i.e., the number of bilayer stacks, can be from 1 to 10,000, although a greater number can also be employed.

Figure 2A:
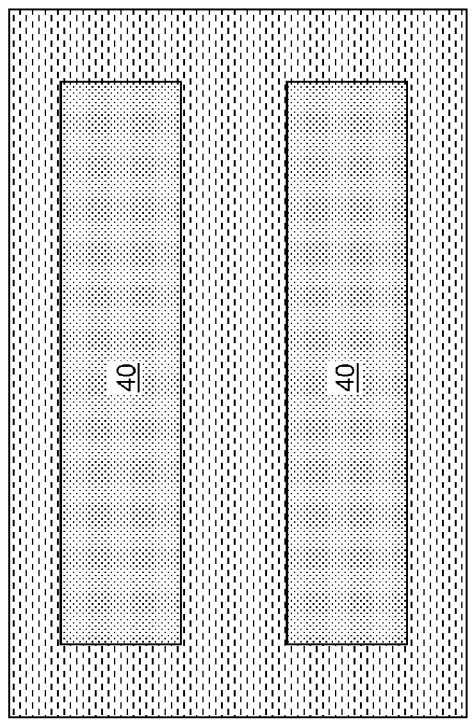
FIG. 2A is a top-down of the first exemplary structure after formation of fin structures by patterning the vertical stack of carbon nanotube attracting material layers and carbon nanotube repelling material layers according to the first embodiment of the present disclosure.
Figure 2C:
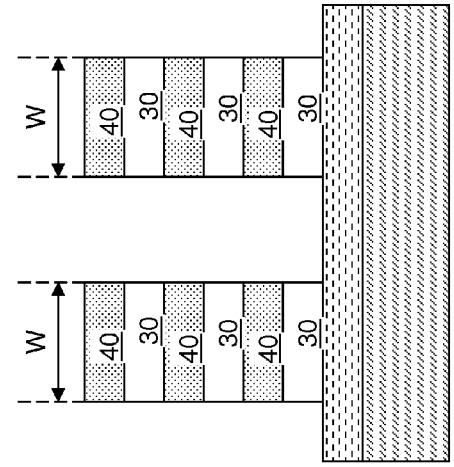
FIG. 2C is a side view of the first exemplary structure of FIG. 2A.
Figure 2B:
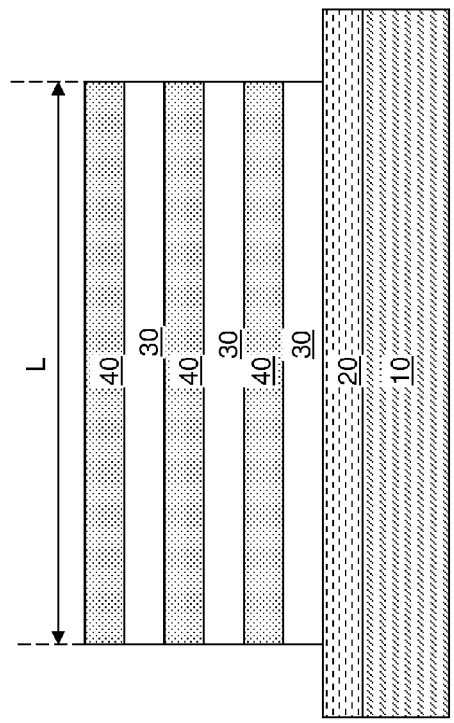
FIG. 2B is a front view of the first exemplary structure of FIG. 2A.

Referring to FIGS. 2A-2C, the at least one vertically alternating stack of the first isoelectric point material layer 30 and the second isoelectric point material layer 40 is patterned to form at least one fin structure. As used herein, a "fin structure" is a structure that protrudes above a top surface of a substrate and has a first pair of sidewalls along a lengthwise direction that is longer than a second pair of sidewalls along a widthwise direction. For example, each fin structure can have a length L along the lengthwise direction, which is a first horizontal direction that is perpendicular to the surface normal of the top surface of the dielectric material layer 20, and has a width W along the widthwise direction, which is a second horizontal direction that is perpendicular to the surface normal of the top surface of the dielectric material layer 20 and perpendicular to the lengthwise direction. The length L is greater than the width W.

While the present disclosure is illustrated with fin structures, the methods of the present disclosure can also be applied to structures other than fin structures. As long as a stack of planar layers can be patterned to have vertical sidewalls having a length greater than a width such that the length is greater than the average length of carbon nanotubes and the width is less than the average length of carbon nanotubes, the methods of the present disclosure can also be employed.

Each fin structure can be patterned, for example, by applying a photoresist (not shown) on the topmost layer among the first and second isoelectric point material layers (30, 40), lithographically patterning the photoresist by exposure and development, and transferring the pattern in the photoresist into the at least one vertically alternating stack of the first and second isoelectric point material layers (30, 40) by an anisotropic etch that employs the patterned photoresist as an etch mask.

Each first isoelectric point material layer 30 has first lengthwise sidewalls that extend along the lengthwise direction, and each second isoelectric point material layer 40 has second lengthwise sidewalls that extend along the lengthwise direction. The first lengthwise sidewalls and the second lengthwise sidewalls can be located within two parallel vertical planes, which vertically coincide with the location of the sidewalls of the photoresist. The patterned photoresist is subsequently removed, for example, by ashing.

In one embodiment, the width W can be less than ½ of the length L, and each first isoelectric point material layer 30 can have a height that is less than ½ of the length L.

In one embodiment, the width W can be less than 1/10 of the length L, and each first isoelectric point material layer 30 can have a height that is less than 1/10 of the length L.

In one embodiment, the width W can be less than 1/30 of the length L, and each first isoelectric point material layer 30 can have a height that is less than 1/30 of the length L.

In one embodiment, the width W can be from 10 nm to 50 microns, the length L can be from 10 nm to 50 microns, and each first isoelectric point material layer 30 can have a height from 1.5 nm to 150 nm, although lesser and greater widths W, lesser and greater lengths L, and lesser and greater heights can also be employed.

Figure 3A:
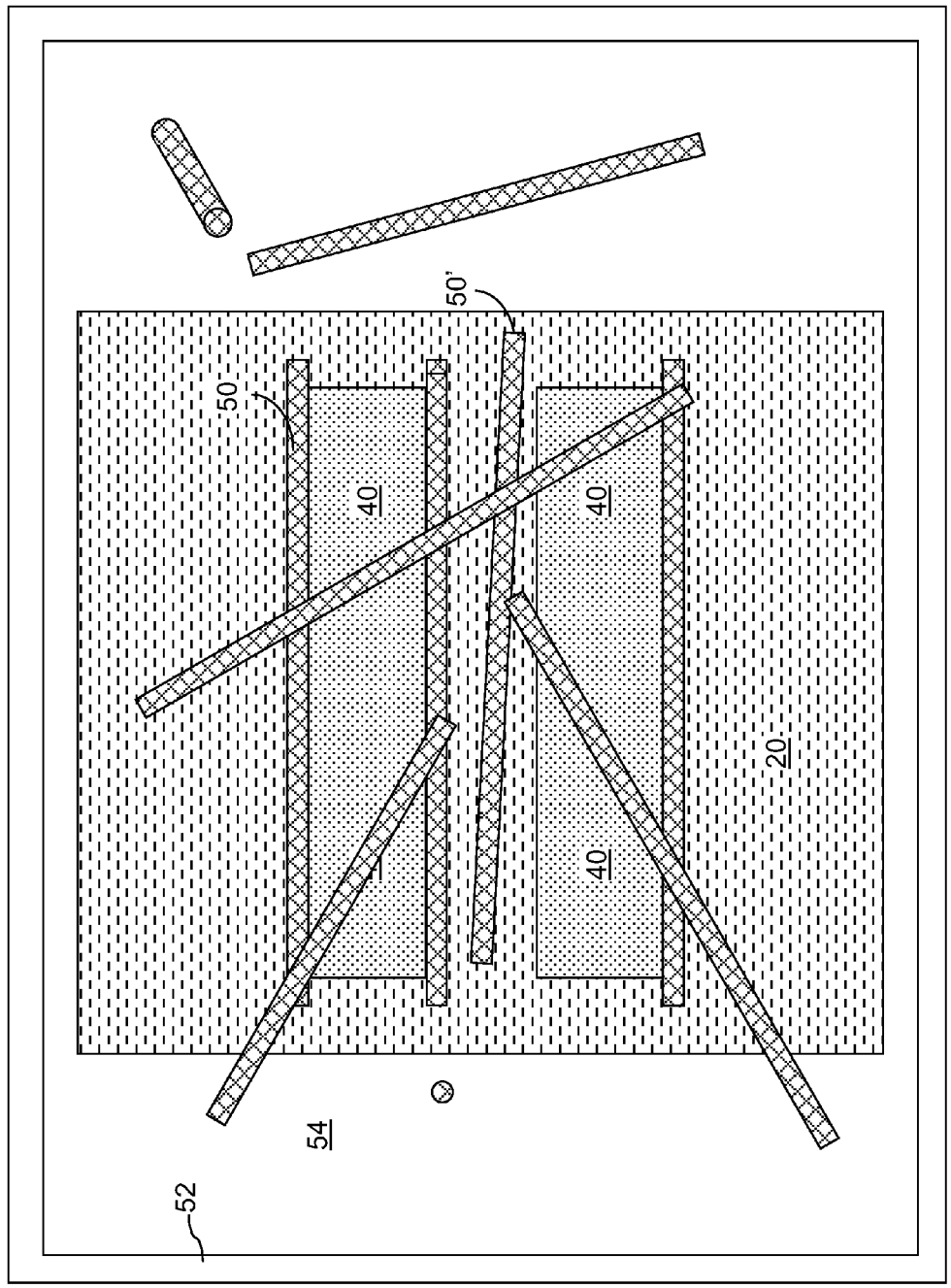
FIG. 3A is a top-down of the first exemplary structure during immersion in a carbon nanotube including bath in which carbon nanotubes become attached to the carbon nanotube attracting material layers in self-alignment according to the first embodiment of the present disclosure.
Figure 3B:
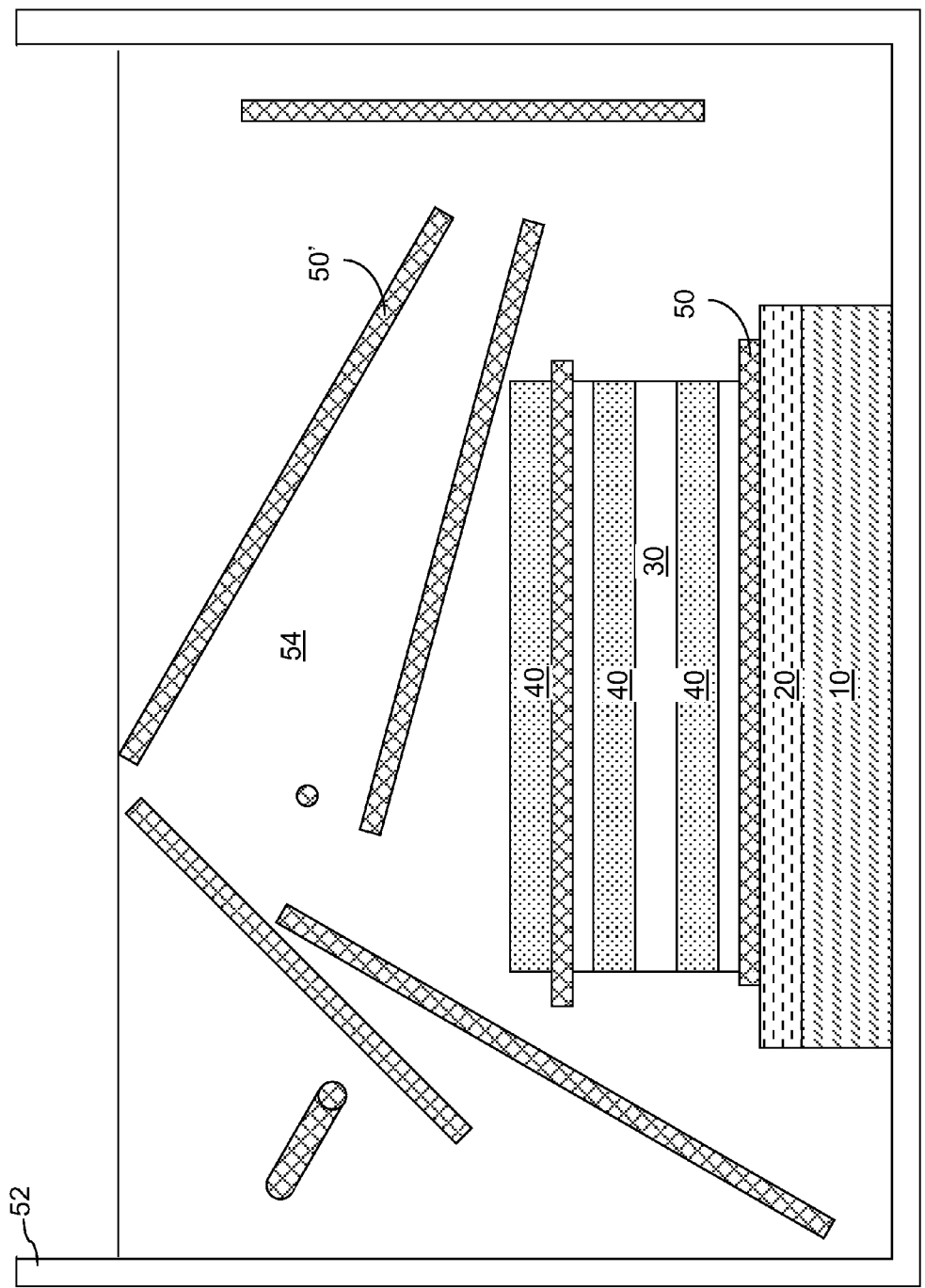
FIG. 3B is a front view of the first exemplary structure of FIG. 3A.
Figure 3C:
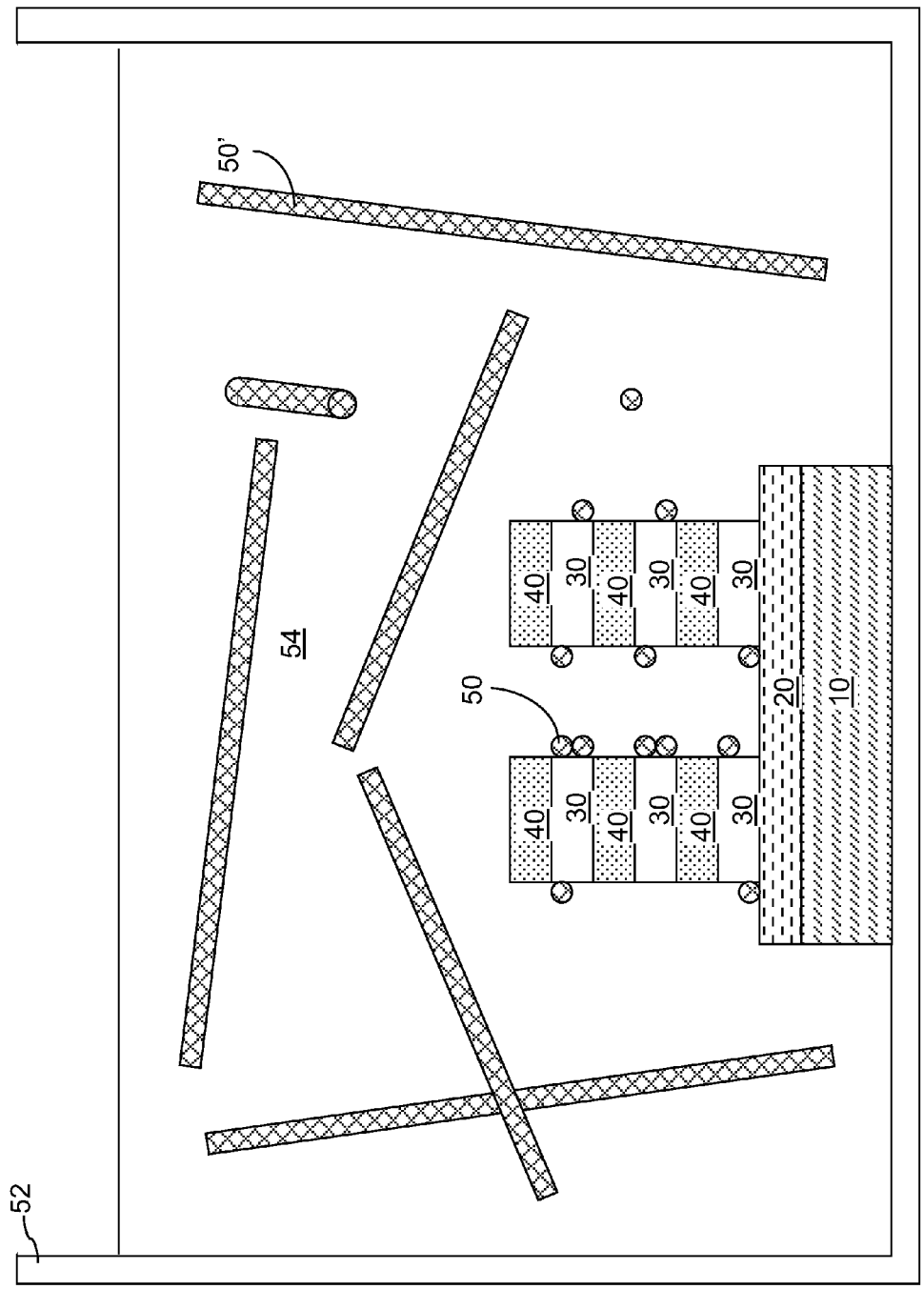
FIG. 3C is a side view of the first exemplary structure of FIG. 3A.

Referring to FIGS. 3A-3C, a carbon nanotube including bath is provided. Specifically, a carbon nanotube including solution 54 is provided in a basin 52. The carbon nanotube including solution is an aqueous solution including free-floating carbon nanotubes 50'. The aqueous solution can be provided from deionized water having a pH of 7.0. Optionally, the pH can be adjusted by adding an acid or a base to alter the pH of the aqueous solution to a value between the first isoelectric point and the second isoelectric point.

Carbon nanotubes are added into the aqueous solution to form the carbon nanotube including solution. The carbon nanotubes can be selected such that the length L can be at least ½ of an average length of the carbon nanotubes. In one embodiment, the carbon nanotubes can be selected such that at least 50% of the carbon nanotubes have a length between 70% and 130% of the average length of the carbon nanotubes. In one embodiment, the carbon nanotubes can be selected such that the length L is between 80% and 120% of the average length of the carbon nanotubes. In one embodiment, the length L can be at least ½ of an average length of the carbon nanotubes, and the width W is less than ¼ of the average length of the carbon nanotubes.

In addition, an ionic surfactant is added to the carbon nanotube including solution 54. In one embodiment, the ionic surfactant is an anionic surfactant that becomes attached to the free-floating carbon nanotubes 50' and imparts negative charges (electrons) to the free-floating carbon nanotubes 50'. In another embodiment, the ionic surfactant is a catioinic surfactant that becomes attached to the free-floating carbon nanotubes 50' and imparts positive charges to, i.e., removes electrons from, the free-floating carbon nanotubes 50'.

The structure including the substrate 10, the dielectric material layer 20, and the at least one fin structure (30, 40) is immersed into the carbon nanotube including solution 54.

In one embodiment, the first isoelectric point is greater than the second isoelectric point, and the ionic surfactant is an anionic surfactant. An exemplary anionic surfactant is sodium dodecyl sulfate (SDS). For example, each first isoelectric point material layer 30 can include a material selected from silicon nitride and a dielectric metal oxide, and each second isoelectric point material layer 40 can include silicon oxide. In this case, surfaces of each first isoelectric point material layer 30 in contact with the carbon nanotube including solution 54 becomes positively charged because the first isoelectric point is greater than the pH of the carbon nanotube including solution 54. Surfaces of each second isoelectric point material layer 40 in contact with the carbon nanotube including solution 54 becomes negatively charged because the second isoelectric point is less than the pH of the carbon nanotube including solution 54. The free-floating carbon nanotubes 50' become negatively charged by the anionic surfactants. The free-floating carbon nanotubes 50' become electrostatically attracted to, and become attached to, the at least one first isoelectric point material layer 30 by electrostatic force. The free-floating carbon nanotubes 50' are electrostatically repelled from the at least one second isoelectric point material layer by electrostatic force.

In another embodiment, the first isoelectric point is less than the second isoelectric point, and the ionic surfactant is a cationic surfactant. For example, each first isoelectric point material layer 30 can include silicon oxide, and each second isoelectric point material layer 40 can include a material selected from silicon nitride and a dielectric metal oxide. In this case, surfaces of each first isoelectric point material layer 30 in contact with the carbon nanotube including solution 54 becomes negatively charged because the first isoelectric point is less than the pH of the carbon nanotube including solution 54. Surfaces of each second isoelectric point material layer 40 in contact with the carbon nanotube including solution 54 becomes positively charged because the second isoelectric point is greater than the pH of the carbon nanotube including solution 54. The free-floating carbon nanotubes 50' become positively charged by the cationic surfactants. The free-floating carbon nanotubes 50' become electrostatically attracted to, and become attached to, the at least one first isoelectric point material layer 30 by electrostatic force. The free-floating carbon nanotubes 50' are electrostatically repelled from the at least one second isoelectric point material layer by electrostatic force.

In general, free-floating carbon nanotubes 50' become selectively attached to the first isoelectric point material layer(s) 30 by a chemically driven method. Specifically, the surfaces of the first isoelectric point material layer(s) 30 and the free-floating carbon nanotubes 50' become oppositely charged, and the free-floating carbon nanotubes 50' are attracted to, and attached to, the first isoelectric point material layer(s) 30.

The carbon nanotubes 50, as attached to the surfaces of the first isoelectric point material layer(s) 30, are self-aligned to a lengthwise direction along the lengthwise surfaces of the first isoelectric point material layer(s) 30. The assembly of the substrate 10, the dielectric material layer 20, the at least one fin structure (30, 40), and the carbon nanotubes 50 attached to the at least one fin structure (30, 40) is removed from the carbon nanotube including solution 54, by physically lifting up the assembly (10, 20, 30, 40, 50) or by draining the carbon nanotube including solution. Chemical bonds are formed between the carbon nanotubes 50 and the surfaces of the at least one first isoelectric point material layer 30 once the carbon nanotubes 50 make contact with the surfaces of the at least one first isoelectric point material layer 30. The carbon nanotubes 50 remain attached to the surfaces of the at least one first isoelectric point material layer 30 due to the chemical bonds after the assembly (10, 20, 30, 40, 50) is separated from the carbon nanotube including solution 54.

FIGS. 4A-4C illustrate the assembly (10, 20, 30, 40, 50) after removal of the assembly (10, 20, 30, 40, 50) from the carbon nanotube including solution 54. Carbon nanotubes 50 are in direct contact with lengthwise sidewalls of the at least one first isoelectric point material layer 30. Because the carbon nanotubes 50 do not bond to the surfaces of the at least one second isoelectric point material layer 40, the at least one second isoelectric point material layer 40 is not in contact with a surface of any carbon nanotube 50.

In one embodiment, by selecting the width W of each fin structure (30, 40) to be less than a minimum contact distance needed to sustain a physical contact between a carbon nanotube and the widthwise sidewalls of the at least one first isoelectric point material layer, any carbon nanotube 50 on the widthwise sidewalls of the fin structure(s) (30, 40) can be removed. Thus, carbon nanotubes 50 can be located only on the lengthwise sidewalls of the at least one isoelectric point material layer 30, and not in physical contact with any surfaces of the at least one second isoelectric point material layer 40 or any widthwise surfaces of the at least one first isoelectric point material layer 30. In this case, widthwise sidewalls of the fin structure (30, 40) are not in contact with any carbon nanotube 50. Further, each of the carbon nanotubes 50 has a sidewall that is in contact with one of the lengthwise sidewalls of the fin structure(s) (30, 40).

In one embodiment, by selecting the ratio of the length L to a height of any first isoelectric point material layer 30 to be a sufficiently large number, the carbon nanotubes 50 can be oriented along the horizontal lengthwise direction. For example, the ratio of the length L to the height of any of the at least one first isoelectric point material layer 30 can be from 10 to 1,000, although lesser and greater ratios can also be employed.

Figure 5A:
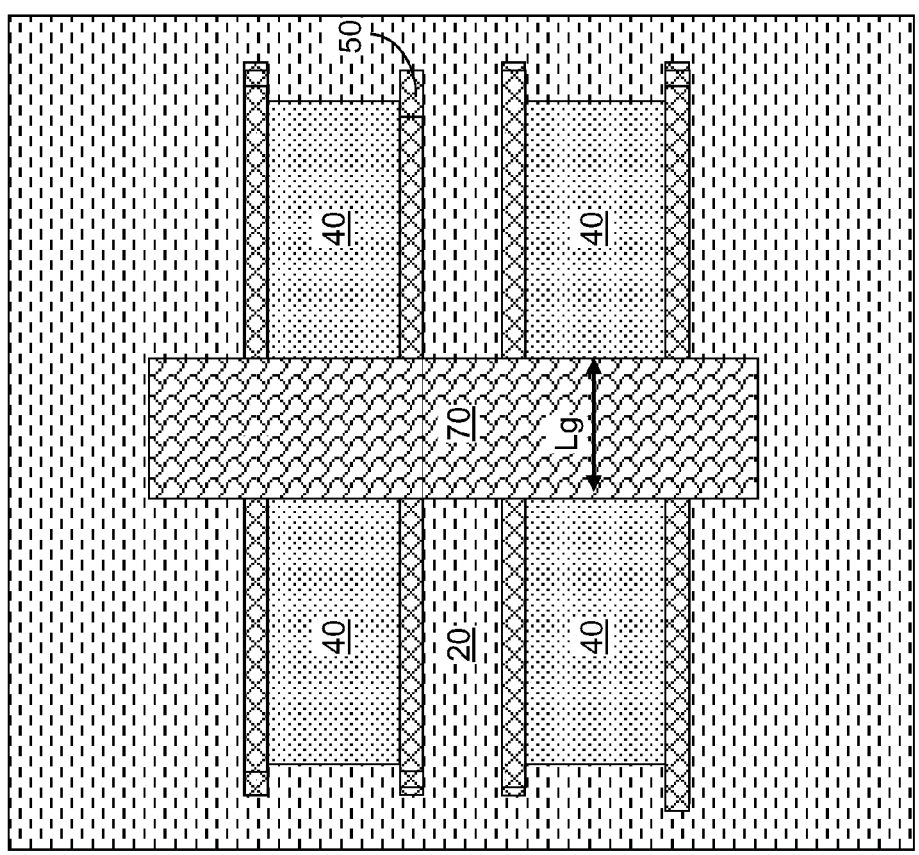
FIG. 5A is a top-down of the first exemplary structure after formation of a gate dielectric and a gate electrode over middle portions of the fin structures according to the first embodiment of the present disclosure.

Referring to FIGS. 5A-5C, a gate dielectric material layer and a conductive material layer are sequentially deposited and patterned to form a gate dielectric 60 and a gate electrode 70. The patterning of the conductive material layer and the gate dielectric material layer can be performed, for example, by application of a photoresist above the conductive material layer, patterning of the photoresist by lithographic exposure and development, transfer of the pattern in the photoresist into the conductive material layer employing the gate dielectric material layer as an etch mask, and removal of the photoresist by ashing and an etch that removes physically exposed portions of the gate dielectric material layer. The remaining portion of the conductive material layer is the gate electrode 70, and the remaining portion of the gate dielectric material layer is the gate dielectric 60.

The gate dielectric 60 can include a silicon oxide-based dielectric material or a high dielectric constant (high-k) dielectric material such as a dielectric metal oxide. The gate electrode 70 includes a conductive material such as a metallic material and/or a doped semiconductor material.

The gate dielectric 60 can be formed directly on middle portions of lengthwise sidewalls of the at least one fin structure (30, 40). The gate conductor 70 overlies the gate dielectric 60. The gate dielectric 60 contacts the fin structure (30, 40) in a dual gate configuration in which the gate dielectric is in contact with middle portions of each carbon nanotube 50 on lengthwise sidewalls of the fin structure (30, 40). The width of the gate dielectric 60, which is the gate length Lg of a transistor to be subsequently formed, can be any lithographic dimension. For example, the gate length Lg can be from 25 nm to 1,000 nm, although lesser and greater gate lengths Lg can also be employed.

Figure 6A:
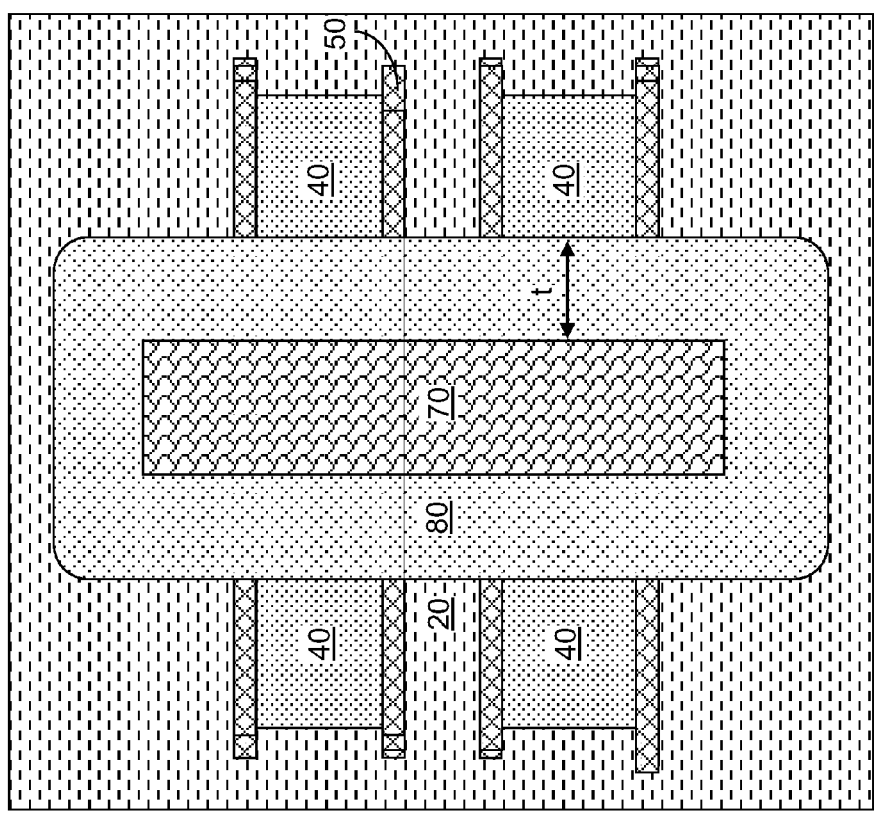
FIG. 6A is a top-down of the first exemplary structure after formation of a dielectric gate spacer according to the first embodiment of the present disclosure.
Figure 6B:
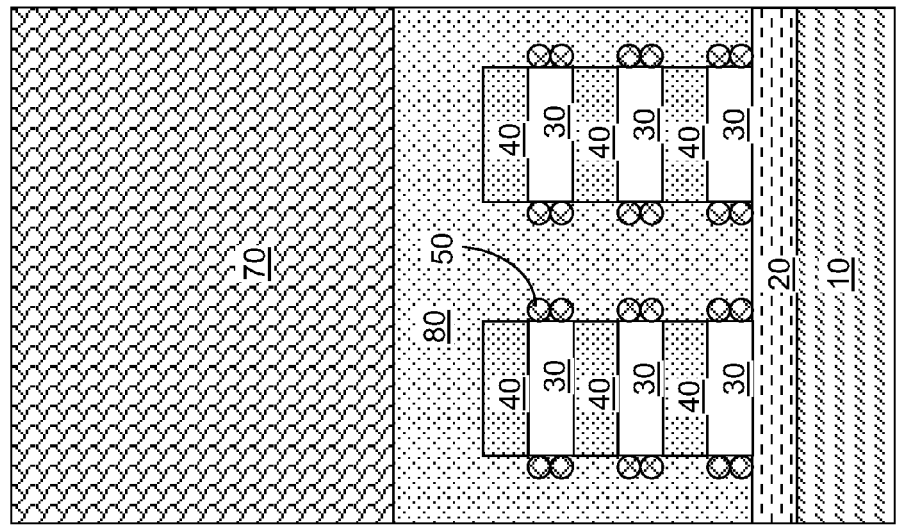
FIG. 6B is a front view of the first exemplary structure of FIG. 6A.
Figure 6C:
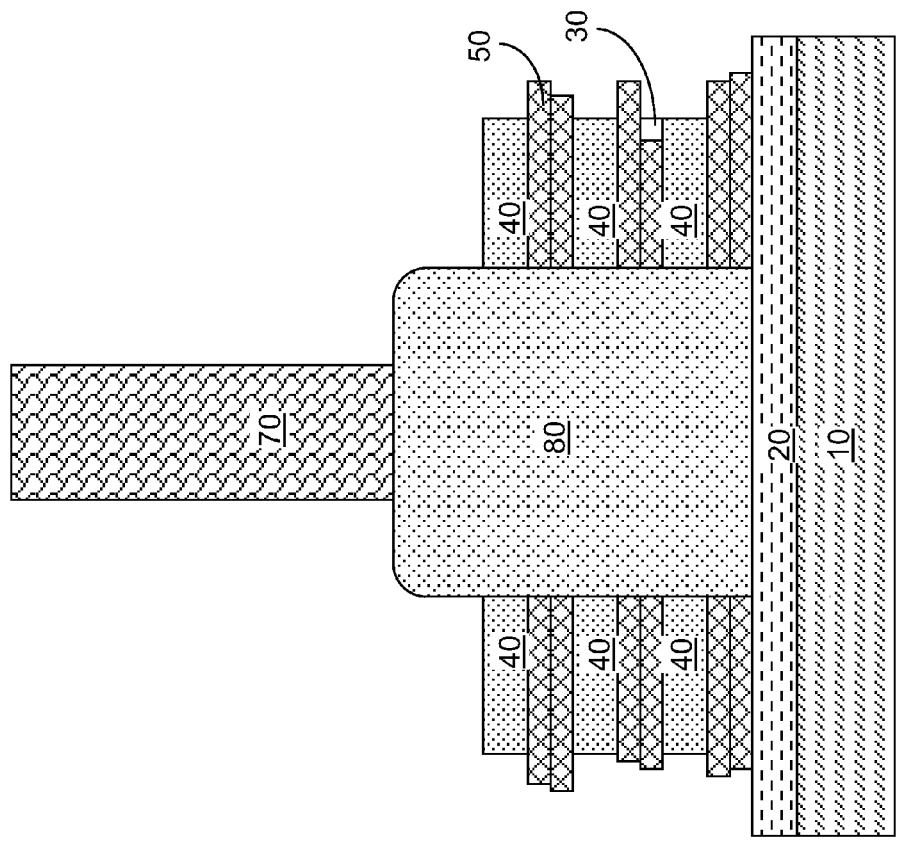
FIG. 6C is a side view of the first exemplary structure of FIG. 6A.

Referring to FIGS. 6A-6C, a dielectric gate spacer 80 is formed by deposition of gate spacer dielectric material layer and a subsequent anisotropic etch of the gate spacer dielectric material layer. The gate spacer dielectric material layer includes a dielectric material such as silicon nitride, silicon oxide, and a dielectric metal oxide. Horizontal portions of the gate spacer dielectric material layer are removed during the anisotropic etch, and remaining vertical portions of the gate spacer dielectric material layer constitute the dielectric gate spacer 80 that laterally surround the stack of the gate dielectric 60 and the gate electrode 70. The thickness t of the gate spacer 80 can be from 10 nm to 1,000 nm, although lesser and greater thicknesses can also be employed.

Figure 7A:
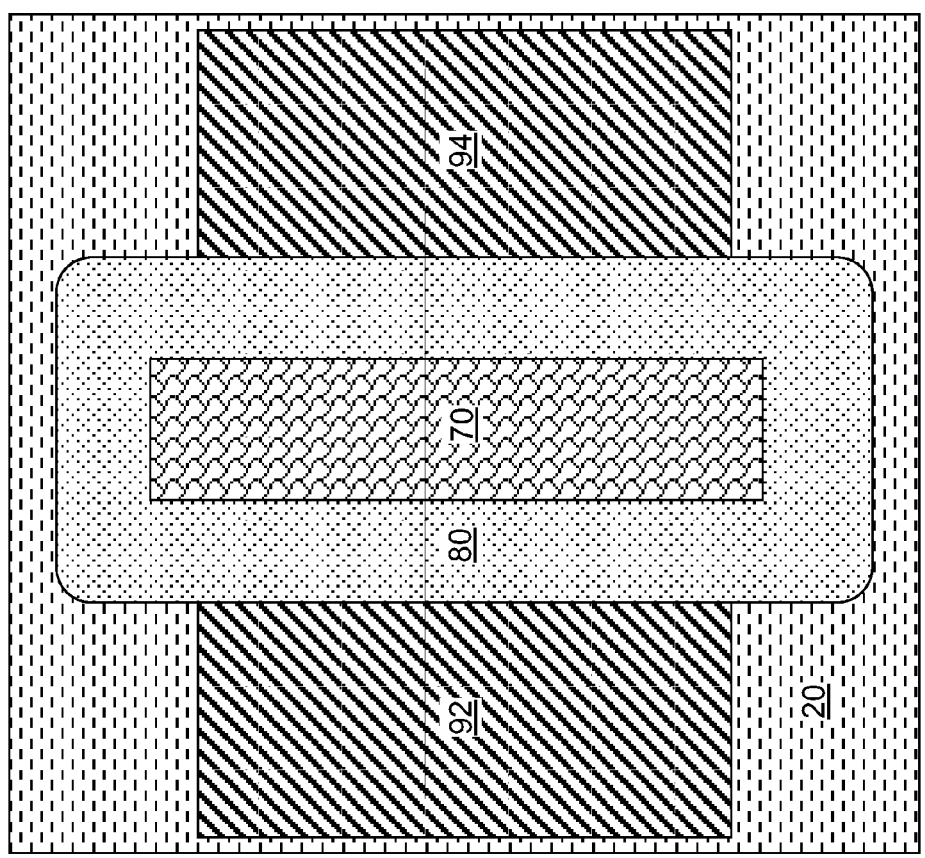
FIG. 7A is a top-down of the first exemplary structure after formation of a source-side metal contact structure and a drain-side metal contact structure according to the first embodiment of the present disclosure.
Figure 7C:
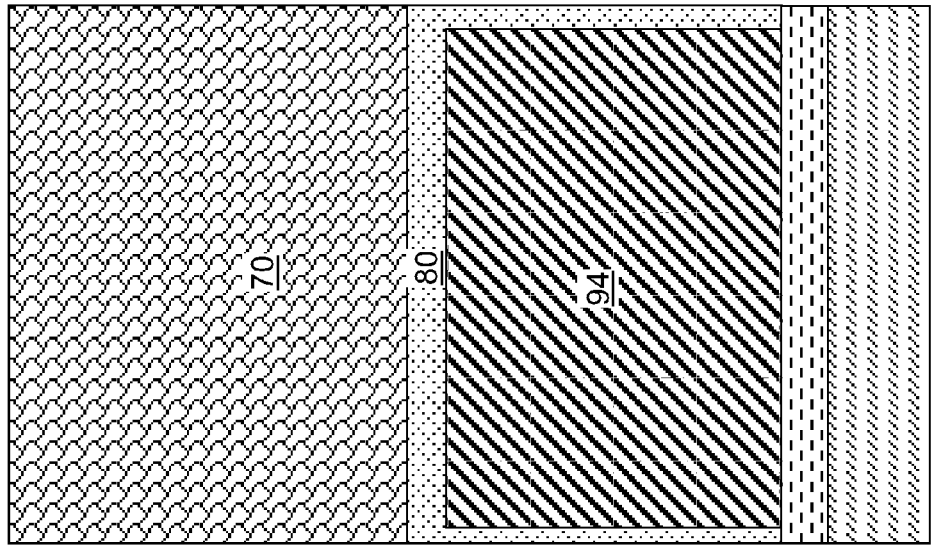
FIG. 7C is a side view of the first exemplary structure of FIG. 7A.
Figure 7B:
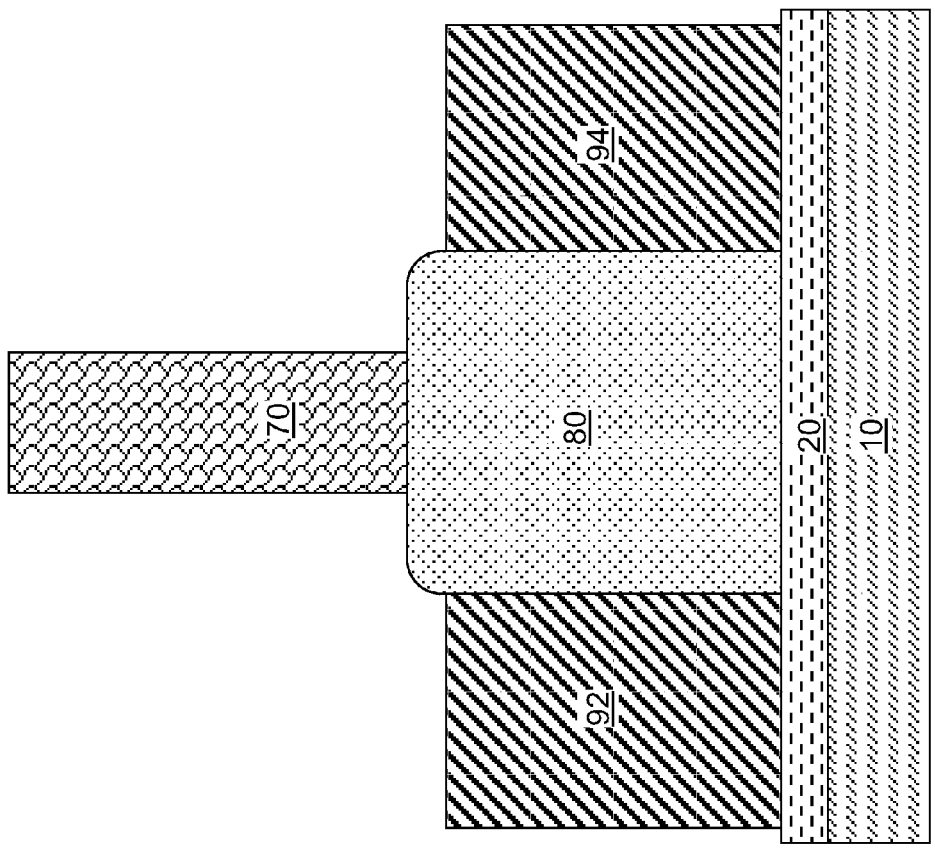
FIG. 7B is a front view of the first exemplary structure of FIG. 7A.

Referring to FIGS. 7A-7C, a source-side contact structure 92 can be formed directly on the attached carbon nanotubes 50 at one side of the gate conductor 70, and a drain-side contact structure 94 can be formed directly on the attached carbon nanotubes 70 at another side of the gate conductor 70. The source-side contact structure 92 can be in contact with one end of each carbon nanotube 50, and the drain-side contact structure 94 can be in contact with the other end of each carbon nanotube 50. The end portions of the carbon nanotubes 50 that are in contact with the source-side contact structure 92 collectively function as a source of a field effect transistor. The end portions of the carbon nanotubes 50 that are in contact with the drain-side contact structure 94 collectively function as a drain of the field effect transistor. The gate conductor 70 functions as the gate of the field effect transistor. The gate dielectric 60 functions as the gate dielectric of the field effect transistor.

The lengthwise directions of the fin structures can be lithographically controlled. Because the carbon nanotubes 50 are self-aligned along the lengthwise direction of the fin structures (30, 40), the carbon nanotubes 50 are aligned to the direction selected by lithographic methods. Thus, additional lithographic methods can be employed to form additional structures, such as a gate electrode 70 and various contact structures (92, 94) on the carbon nanotubes 50. In addition, by aligning multiple carbon nanotubes 50 on common vertical lengthwise sidewalls of the fin structures (30, 40), areal density of aligned carbon nanotubes 50 can be increased by a factor of the total number of vertically overlapping carbon nanotubes compared to single carbon nanotube devices. Thus, high current density devices employing carbon nanotubes can be formed.

While a field effect transistor is disclosed herein, any other semiconductor devices employing a conductive channel (using metallic carbon nanotubes) or a semiconducting channel (using semiconducting carbon nanotubes) can also be formed employing the methods of the present disclosure.

Referring to FIGS. 8A and 8B, a second exemplary structure according to a second embodiment of the present disclosure can be derived from the first exemplary semiconductor structure by adding an additional step after the processing steps of FIGS. 2A-2C and before the processing steps of FIGS. 3A-3C. Specifically, the sidewall surfaces of the at least one first isoelectric point material layer 30 can be laterally etched and recessed inward relative to sidewall surfaces of the at least one second isoelectric point material layer 30. This lateral etch can be performed by a wet etch or a dry etch that etches the first isoelectric point material selective to the second isoelectric point material. The lateral recess of the at least one first isoelectric point material layer 30 can enhance the lateral alignment of the carbon nanotubes 50 during the processing step of FIGS. 3A-3C by repelling free-floating carbon nanotubes 50' that are not horizontal due to the additional repellant electrostatic force between horizontal surfaces of the at least one second isoelectric point material layer 40 and the free-floating carbon nanotubes 50'.

FIGS. 8A and 8B show the second exemplary structure at a processing step corresponding to the processing step of FIGS. 6A-6C. The first lengthwise sidewalls of the at least one first isoelectric point material layer 30 are laterally offset, and are recessed inward, relative to second lengthwise sidewalls of the at least one second isoelectric point material layer 40. Processing steps of FIGS. 7A-7C can be subsequently performed on the second exemplary structure to provide a field effect transistor that is functionally equivalent to the field effect transistor of FIGS. 7A-7C.

Referring to FIGS. 9A and 9B, a third exemplary structure according to a third embodiment of the present disclosure can be derived from the first exemplary semiconductor structure by adding an additional step after the processing steps of FIGS. 2A-2C and before the processing steps of FIGS. 3A-3C. Specifically, the sidewall surfaces of the at least one second isoelectric point material layer 40 can be laterally etched and recessed inward relative to sidewall surfaces of the at least one first isoelectric point material layer 30. This lateral etch can be performed by a wet etch or a dry etch that etches the second isoelectric point material selective to the first isoelectric point material. The lateral recess of the at least one second isoelectric point material layer 40 can enhance the rate of attachment of the carbon nanotubes 50 to the lengthwise sidewalls of the at least one first isoelectric point material layer 30 during the processing step of FIGS. 3A-3C by effectively reducing the repulsive force between free-floating carbon nanotubes 50' and the sidewalls of the at least one second isoelectric point material layer 40.

FIGS. 9A and 9B show the third exemplary structure at a processing step corresponding to the processing step of FIGS. 6A-6C. The first lengthwise sidewalls of the at least one first isoelectric point material layer 30 are laterally offset, and protrude outward, relative to second lengthwise sidewalls of the at least one second isoelectric point material layer 40. Processing steps of FIGS. 7A-7C can be subsequently performed on the third exemplary structure to provide a field effect transistor that is functionally equivalent to the field effect transistor of FIGS. 7A-7C.

While the disclosure has been described in terms of specific embodiments, it is evident in view of the foregoing description that numerous alternatives, modifications and variations will be apparent to those skilled in the art. The various embodiments of the present disclosure can be implemented solely, or in combination with any other embodiments described herein unless incompatibility among various embodiments are expressly stated or otherwise clear to one of ordinary skill in the art. Accordingly, the disclosure is intended to encompass all such alternatives, modifications and variations which fall within the scope and spirit of the disclosure and the following claims.

What is claimed is:

1. A structure comprising:
a fin structure located on a substrate, having a length in a lengthwise direction and a width in a widthwise direction, and comprising at least one pair of layers, wherein each pair of layers within said at least one pair of layers includes a first isoelectric point material layer having a first isoelectric point and a second isoelectric point material layer having a second isoelectric point that is different from said first isoelectric point;
carbon nanotubes located on lengthwise sidewalls of said at least one first isoelectric point material layer, wherein at least one second isoelectric point material layer is not in contact with a surface of any carbon nanotube;
a gate dielectric contacting a portion of lengthwise sidewalls of said fin structure; and
a gate conductor overlying said gate dielectric.

2. The structure of claim 1, wherein said carbon nanotubes are oriented along said horizontal lengthwise direction.

3. The structure of claim 1, wherein widthwise sidewalls of said fin structure are not in contact with any carbon nanotube.

4. The structure of claim 1, wherein said first isoelectric point is greater than said second isoelectric point.

5. The structure of claim 4, wherein said first isoelectric point material layer includes a material selected from silicon nitride and a dielectric metal oxide, and said second isoelectric point material layer includes silicon oxide.

6. The structure of claim 4, wherein said first isoelectric point is greater than said second isoelectric point by at least 2.0.

7. The structure of claim 1, wherein said width is less than ½ of said length, and each of said at least one first isoelectric point material layer has a height that is less than ½ of said length.

8. The structure of claim 1, wherein said width is less than 1/10 of said length, and each of said at least one first isoelectric point material layer has a height that is less than 1/10 of said length.

9. The structure of claim 1, wherein said at least one pair of layers is a plurality of pairs of layers that constitute an alternating stack of said first isoelectric point material layer and said second isoelectric point material layer.

10. The structure of claim 9, wherein each first isoelectric point material layer has first lengthwise sidewalls and each second isoelectric point material layer has second lengthwise sidewalls, wherein said first lengthwise sidewalls and said second lengthwise sidewalls are located within two parallel vertical planes.

11. The structure of claim 9, wherein each first isoelectric point material layer has first lengthwise sidewalls and each second isoelectric point material layer has second lengthwise sidewalls, wherein said first lengthwise sidewalls and said second lengthwise sidewalls are laterally offset by an offset distance.

12. The structure of claim 9, wherein said first isoelectric point is greater than said second isoelectric point by at least 2.0.

13. The structure of claim 1, wherein each of said carbon nanotubes has a sidewall that is in contact with one of said lengthwise sidewalls.

14. A structure comprising:
  a fin structure located on a substrate, having a length in a lengthwise direction and a width in a widthwise direction, and comprising at least one pair of layers, wherein each pair of layers within said at least one pair of layers includes a first isoelectric point material layer having a first isoelectric point and a second isoelectric point material layer having a second isoelectric point that is different from said first isoelectric point;
  carbon nanotubes located on lengthwise sidewalls of said at least one first isoelectric point material layer wherein at least one second isoelectric point material layer is not in contact with a surface of any carbon nanotube;
  a gate dielectric contacting a portion of lengthwise sidewalls of said fin structure;
  a gate conductor overlying said gate dielectric;
  a source-side contact structure in contact with said carbon nanotubes at one side of said gate conductor; and
  a drain-side contact structure in contact with said carbon nanotubes at another side of said gate conductor.

15. The structure of claim 14, wherein said carbon nanotubes are oriented along said horizontal lengthwise direction.

16. The structure of claim 14, wherein widthwise sidewalls of said fin structure are not in contact with any carbon nanotube.

17. The structure of claim 14, wherein said first isoelectric point is greater than said second isoelectric point.

18. The structure of claim 17, wherein said first isoelectric point material layer includes a material selected from silicon nitride and a dielectric metal oxide, and said second isoelectric point material layer includes silicon oxide.

19. The structure of claim 17, wherein said first isoelectric point is greater than said second isoelectric point by at least 2.0.

20. The structure of claim 14, wherein said width is less than 1/2 of said length, and each of said at least one first isoelectric point material layer has a height that is less than 1/2 of said length.

21. The structure of claim 14, wherein said width is less than 1/10 of said length, and each of said at least one first isoelectric point material layer has a height that is less than 1/10 of said length.

22. The structure of claim 14, wherein said at least one pair of layers is a plurality of pairs of layers that constitute an alternating stack of said first isoelectric point material layer and said second isoelectric point material layer.

23. The structure of claim 22, wherein each first isoelectric point material layer has first lengthwise sidewalls and each second isoelectric point material layer has second lengthwise sidewalls, wherein said first lengthwise sidewalls and said second lengthwise sidewalls are located within two parallel vertical planes.

24. The structure of claim 22, wherein each first isoelectric point material layer has first lengthwise sidewalls and each second isoelectric point material layer has second lengthwise sidewalls, wherein said first lengthwise sidewalls and said second lengthwise sidewalls are laterally offset by an offset distance.

25. The structure of claim 14, wherein each of said carbon nanotubes has a sidewall that is in contact with one of said lengthwise sidewalls.

* * * * *